United States Patent
Rarick

(10) Patent No.: US 6,643,838 B2
(45) Date of Patent: Nov. 4, 2003

(54) SYSTEM AND METHOD OF PLACING COMPONENTS FOR MINIMIZING WIRE CONGESTION AND WIRE LENGTH IN PERFORMING A FUNCTION

(75) Inventor: Leonard D. Rarick, San Diego, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 120 days.

(21) Appl. No.: 10/023,007

(22) Filed: Dec. 17, 2001

(65) Prior Publication Data

US 2003/0115565 A1 Jun. 19, 2003

(51) Int. Cl.⁷ .............................................. G06F 17/50
(52) U.S. Cl. .............................. 716/13; 716/14; 716/10; 716/11; 716/8; 716/2; 716/12
(58) Field of Search .............................. 716/13, 10, 8, 716/12, 2, 1; 700/121

(56) References Cited

U.S. PATENT DOCUMENTS

| | | | | |
|---|---|---|---|---|
| 5,798,936 A | * | 8/1998 | Cheng .......................... | 716/13 |
| 5,835,378 A | * | 11/1998 | Scepanovic et al. ........ | 700/121 |
| 5,841,674 A | * | 11/1998 | Johannsen .................... | 716/12 |
| 5,859,781 A | * | 1/1999 | D'Haeseleer et al. .......... | 716/8 |
| 6,070,108 A | * | 5/2000 | Andreev et al. ............ | 700/121 |
| 6,123,736 A | * | 9/2000 | Pavisic et al. ................. | 716/2 |
| 6,463,575 B1 | * | 10/2002 | Takahashi .................... | 716/10 |
| 2001/0014965 A1 | * | 8/2001 | Hiraga ......................... | 716/13 |
| 2002/0010899 A1 | * | 1/2002 | Wallace ......................... | 716/2 |
| 2003/0009731 A1 | * | 1/2003 | Wallace ......................... | 716/5 |

* cited by examiner

Primary Examiner—Vuthe Siek
Assistant Examiner—Magid Y Dimyan
(74) Attorney, Agent, or Firm—O'Melveny & Myers LLP

(57) ABSTRACT

A system and method is provided of placing components on a chip for performing a function in order to minimize wire length and wire congestion. In a preferred embodiment of the present invention, a plurality of components, which are adapted to receive a plurality of bits, are arranged in lines that are substantially parallel to one another. Within each line, the components are arranged such that the component adapted to receive the least-significant bit ("LSB") for that line is positioned at a first end of the line, and a component adapted to receive the most-significant bit ("MSB") for that line is positioned at a second end of the line. The lines are then oriented such that the first end of all odd numbered lines are adjacent the second end of all even-numbered lines (i.e., in a serpentine fashion). The plurality of components are then electrically connected. In one embodiment of the present invention, each component is electrically connected to a next-least-significant component and a similarly-positioned component from the next-least-significant similarly-oriented line through a wire. In another embodiment of the present invention, each component is electrically connected to a next-most-significant component and a similarly-positioned component from the next-most-significant similarly-oriented line.

25 Claims, 6 Drawing Sheets

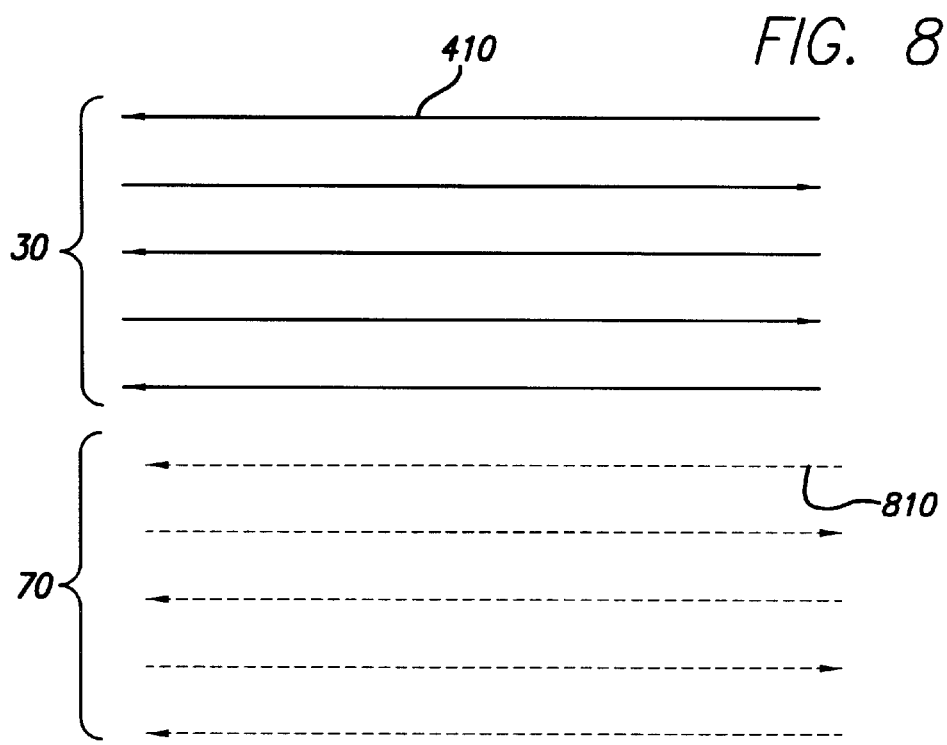
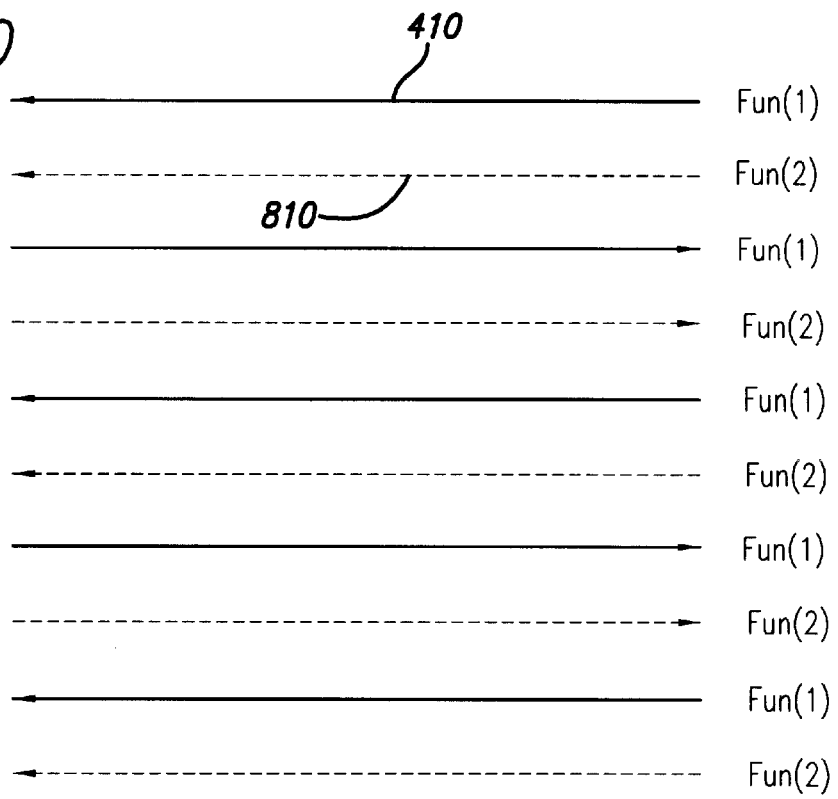

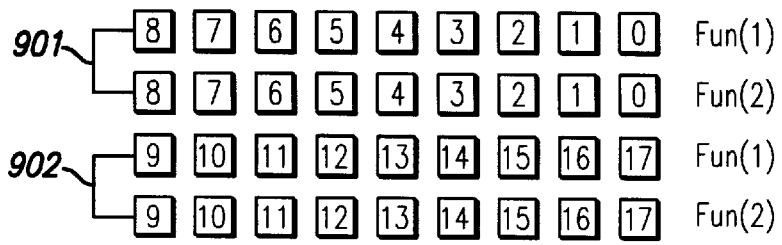
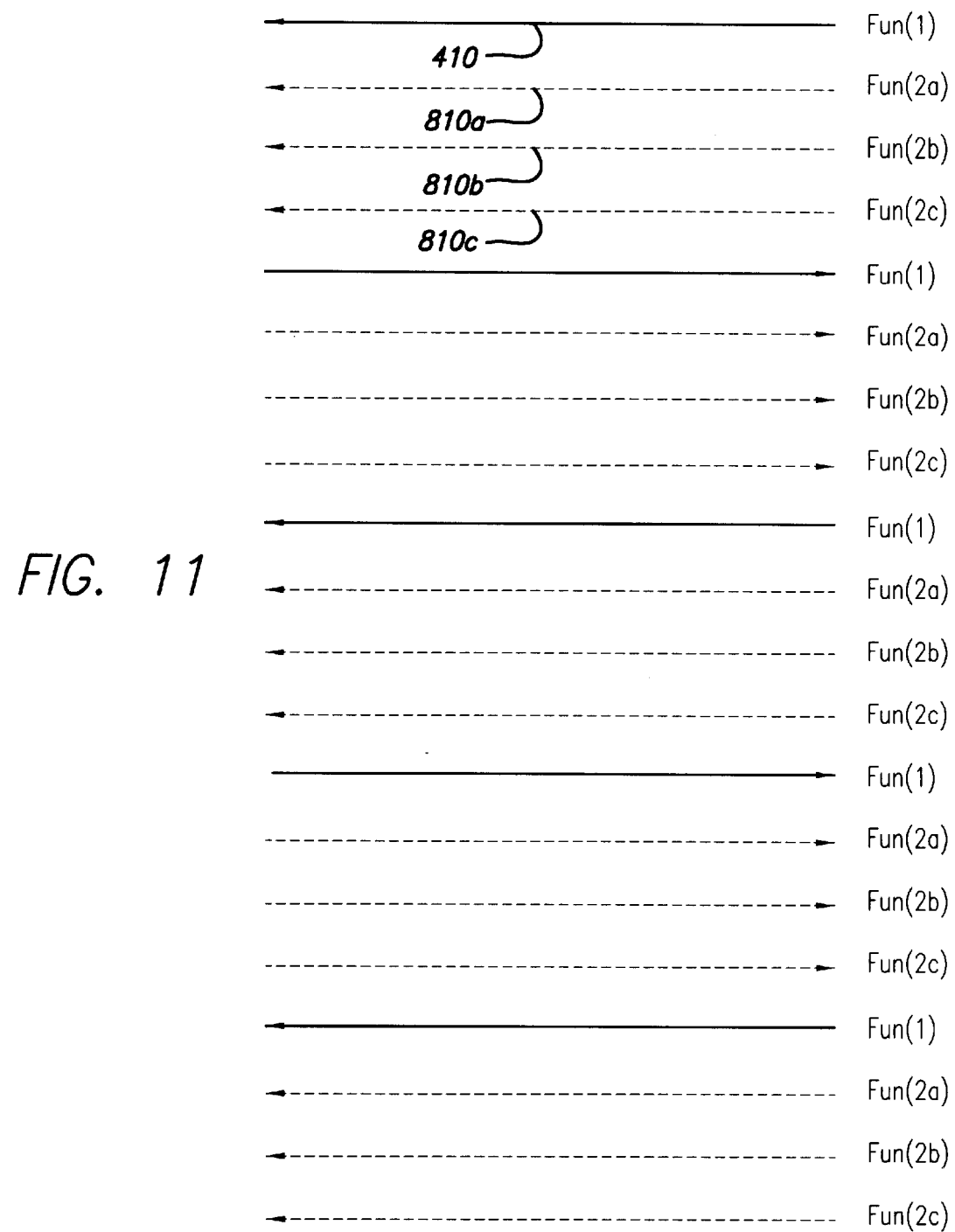
FIG. 9
FIG. 11

SYSTEM AND METHOD OF PLACING COMPONENTS FOR MINIMIZING WIRE CONGESTION AND WIRE LENGTH IN PERFORMING A FUNCTION

BACKGROUND OF THE INVENTION

1. Field of the Invention

The present invention relates to the placement of components for performing a function, or more particularly, to a system and method of placing components on a chip for performing a function in order to minimize wire congestion and wire length.

2. Description of Related Art

Electronic circuits are commonly used in today's marketplace to produce needed results or provided valuable information. Typically, electronic circuits will utilize several embedded functions in order to produce a particular result. For example, a public key encryption circuit may utilize several shifting functions, adding functions, and flip-flop functions in order to produce an encrypted result. The components that perform these functions (e.g., shifting, adding, and flip-flop) are typically arranged on a chip such that information is passed from function to function in a pipeline (or serial) fashion. In other words, each function is laid out parallel to the other functions so the component adapted to receive the least-significant bit (LSB) of the first function is immediately adjacent to the component adapted to receive the LSB of the second function and the component adapted to receive the most-significant bit (MSB) of the first function is immediately adjacent to the component adapted to receive the MSB of the second function. This allows the data associated with certain bits (e.g., bit 0, bit 1, etc.) to flow serially from function to function.

A drawback of this type of component arrangement is that it becomes problematic when a large number of data bits (e.g., thousands of data bits) are being manipulated to produce a certain result. This is because data does not only move in a vertical direction (i.e., from function to function), but also in a horizontal direction (i.e., from component to component within a single function). For example, in a shifter, data from bit 7 may need to be "shifted" to bit 8. Or more problematic, data from bit 7 may need to be "shifted" to bit 1024. To enable a function to move data horizontally (i.e., from component to component within a single function), horizontally-oriented wires are used to interconnect the various components of a function. This results in either wires spanning over large distance (e.g., from bit 0 to bit 1024), or a large number of wires spanning over smaller distances (e.g., from bit 0 to bit 1, from bit 1 to bit 2, etc.)—the former causing wire congestion and the latter causing slow response time (e.g., moving data one bit at a time). This requires the designer of to choose between circuit size (e.g., a larger circuit may be need if wires are congested) and circuit speed.

Thus, a need exists, and it would be desirable to have a system and method of placing components on a chip for performing a function that minimizes wire congestion and wire length without substantially decreasing circuit speed.

SUMMARY OF THE INVENTION

The present invention provides a system and method of placing components on a chip for performing a function in order to minimize wire length and wire congestion. In a preferred embodiment of the present invention, a plurality of components, which are adapted to receive a plurality of bits, are arranged in lines that are substantially parallel to one another. Within each line, the components are arranged such that the component adapted to receive the least-significant bit (LSB) for that line is positioned at a first end of the line, and a component adapted to receive the most-significant bit (MSB) for that line is positioned at a second end of the line. The lines are then oriented such that the first end of all odd numbered lines are adjacent the second end of all even-numbered lines (i.e., in a serpentine fashion). The plurality of components are then electrically connected.

In one embodiment of the present invention, each component is electrically connected to a next-least-significant component and/or a similarly-positioned component from the next-least-significant similarly-oriented line. In another embodiment of the present invention, each component is electrically connected to a next-most-significant component and/or a similarly-positioned component from the next-most-significant similarly-oriented line.

The present invention further provides a system and method of placing components on a chip for performing multiple functions (e.g., a primary and secondary function). Specifically, the lines of components for performing the secondary function are arranged in a serpentine fashion and interlaced amongst the lines of components for performing the primary function. A plurality of inter-function wires are then arranged, electrically connecting the output of the primary function's components to the input of the secondary function's components, in order to minimize wire length and wire congestion. In another embodiment of the present invention, the secondary function further includes multiple sub-functions.

A more complete understanding of the system and method of placing components for minimizing wire congestion and wire length will be afforded to those skilled in the art, as well as a realization of additional advantages and objects thereof, by a consideration of the following detailed description of the preferred embodiment. Reference will be made to the appended sheets of drawings which will first be described briefly.

BRIEF DESCRIPTION OF THE DRAWINGS

FIG. 8 further illustrates how the lines of components depicted in FIG. 7 can be oriented.

FIG. 9 illustrates a preferred embodiment of how components can be arranged on a chip to perform multiple functions and minimize wire length and congestion FIG. 10 further illustrates how the lines of components depicted in FIG. 9 can be oriented.

FIG. 11 further illustrates that each serpentine-shaped line of components for performing a single function, such at the dashed line depicted in FIG. 10, may further include multiple serpentine-shaped lines of components for performing multiple sub-functions.

DETAILED DESCRIPTION OF THE PREFERRED EMBODIMENT

The present invention provides a system and method of placing components on a chip for performing a function in order to minimize wire length and wire congestion. In the detailed description that follows, like element numerals are used to describe like elements illustrated in one or more figures.

Figure 1:
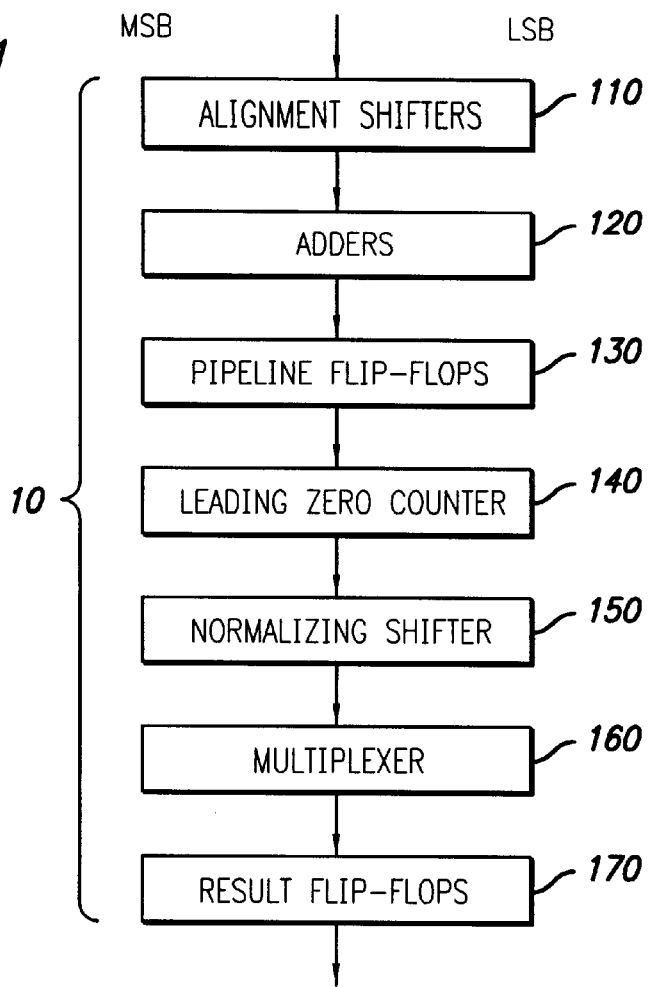
FIG. 1 depicts a series of functions that may be used to produce a certain result.

Typically, a circuit will utilize several embedded functions for producing a particular result. For example, FIG. 1 shows a floating point addition circuit 10 that utilizes a series of functions (i.e., alignment shifting function 110, adding function 120, pipeline flip-flop function 130, leading zero counter function 140, normalizing shifter function 150, multiplexing function 160, and result flip-flop function 170) for producing the floating point sum. As shown in FIG. 1, these functions are typically arranged such that information is passed from function to function in a pipeline (or serial) fashion. In other words, each function is laid out parallel to the other functions so the component adapted to receive the least-significant bit (LSB) of the first function 110 is immediately adjacent the component adapted to receive the LSB of the second function 120 and the component adapted to receive the most-significant bit (MSB) of the first function 110 is immediately adjacent the component adapted to receive the MSB of the second function 120. This allows the data associated with certain bits (i.e., bit 0, bit 1, etc.) to flow serially from function to function.

As described above, this type of component arrangement becomes problematic when a large number of data bits (e.g., thousands of data bits) are being manipulated to produce a certain result. This is because data does not only move in a vertical direction (i.e., from function to function), but also in a horizontal direction (i.e., from component to component within a function).

Figure 2:
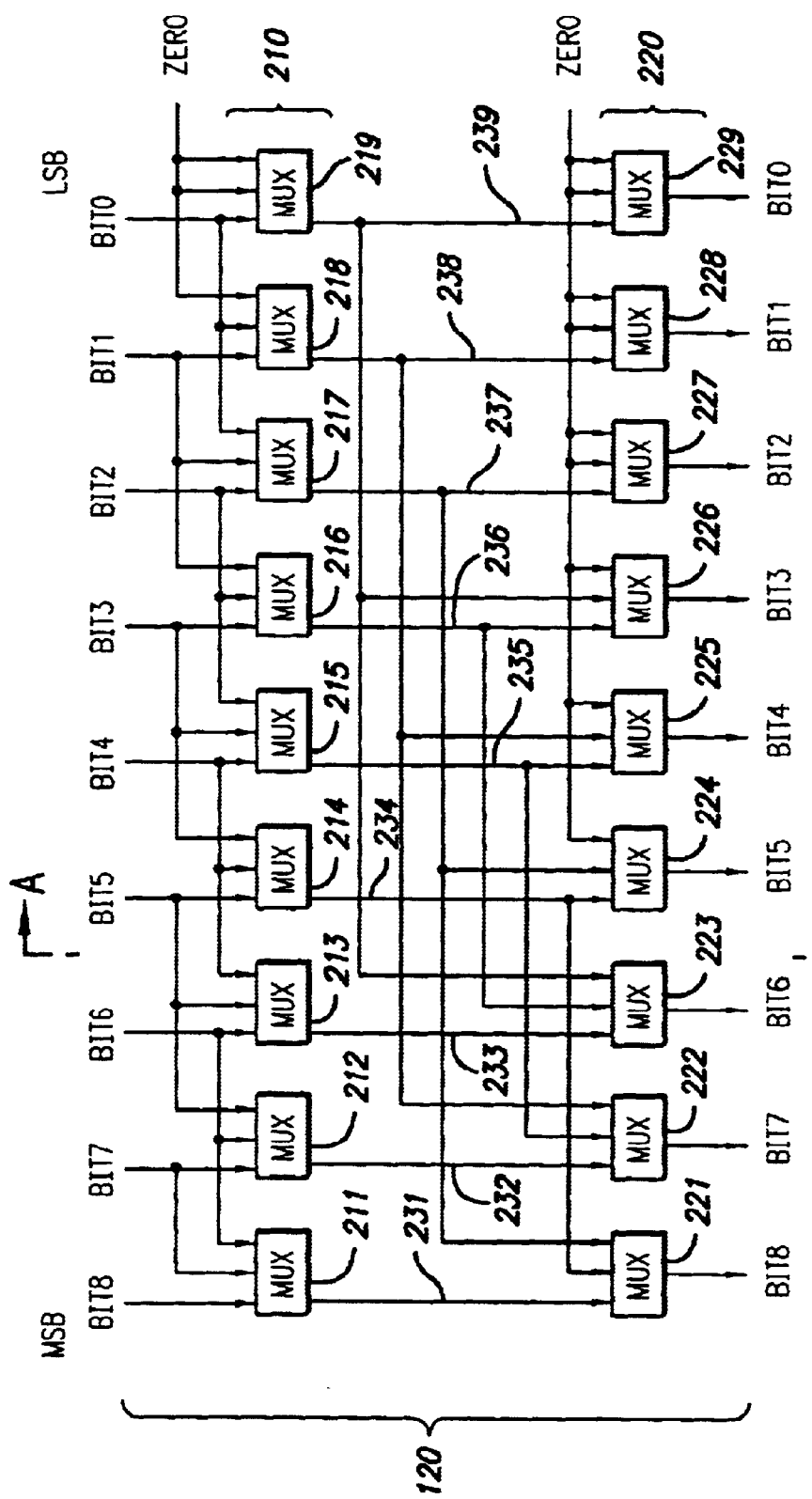
FIG. 2 depicts a prior art arrangement of components for producing the normalizing shifter function shown in FIG. 1.

For example, FIG. 2 illustrates how a plurality of multiplexers (MUXs) (e.g., 211–219 and 221–229) can be used to perform the normalizing shifting function 150 depicted in FIG. 1. More particularly, FIG. 2 shows a first line of MUXs 210 electrically connected to a second line of MUXs 220 via a plurality of wires (e.g., 231–239). By arranging and interconnecting the plurality of MUXs (e.g., 211–219 and 221–229) in this fashion, the incoming data bits can be shifted to produce a certain result. For example, data bit 0 can be shifted to data bit 8 (i.e., the output of MUX 221) by receiving data bit 0 at MUX 217 and moving data bit 0 via wire 237 to MUX 221. The same could be done for data bits 1 through 7.

The problem with such a circuit, however, is that a large number of wires are needed to move data into the plurality of MUXs. This results in a large number of long, wires and a high concentration of wires over certain components. Specifically, at cross-section A, eight wires are needed to shift nine bits of data. Thus, as the number of data bits increase, so too does the number and length of the wires per function. The end result is a high concentration of long wires. This high concentration of wires could be avoided by using a large number of shorter wires for connecting adjacent MUXs (e.g., MUX 219 to MUX 218, MUX 218 to MUX 217, etc.). However, such a design would produce a circuit that operates at an unacceptable speed (e.g., by needing eight clock cycles to shift data eight bits).

Figure 3:
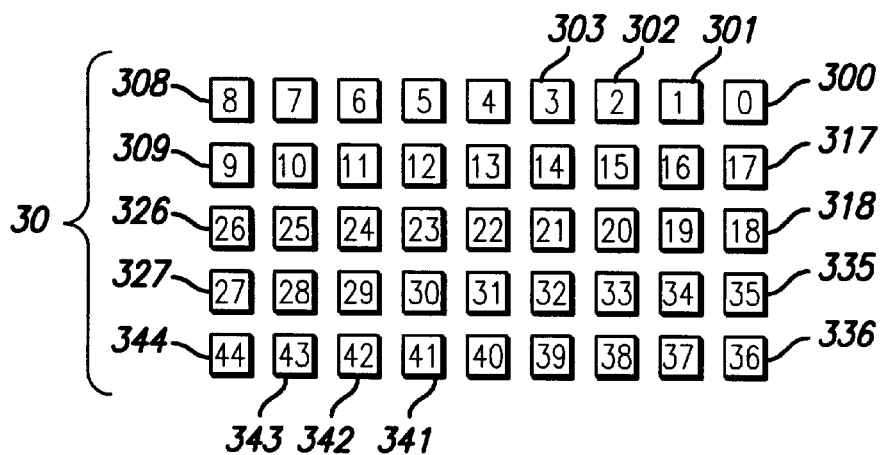
FIG. 3 illustrates a preferred embodiment of how components are arranged on a chip in order to minimize wire length and congestion.

FIG. 3 illustrates a preferred embodiment of an arrangement of components on a chip for minimizing wire length and congestion in accordance with the present invention. It should be appreciated that while the present invention refers to arranging components on a chip, arranging components on a substrate, circuit board, flex board or any other material generally known to those skilled in the art would be within the spirit and scope of the present invention.

More particularly, FIG. 3 shows a series of components for performing a primary function 30, which includes a plurality of lines containing a plurality of components (i.e., 300–344) for performing a primary function. The plurality of components (i.e., 300–344), which are adapted to receive a plurality of bits (i.e., bits 0–44), are arranged in lines (i.e., lines one through five) that are substantially parallel to one another. Within each line, the components are arranged such that the component adapted to receive the LSB for that line is positioned at a first end of the line, and a component adapted to receive the MSB for that line is positioned at a second end of the line. The lines are then oriented such that the first end of all odd-numbered lines are adjacent the second end of all even-numbered lines. In other words, the first end of all odd-numbered lines are opposite the first end of all even-numbered lines.

For example, as shown in FIG. 3, line one includes a plurality of components (i.e., 300–308) adapted to receive a plurality of bits (i.e., bits 0–8), where the component 300 adapted to receive the LSB for line one (i.e., bit 0) is positioned at a first end of the line, and the component 308 adapted to receive the MSB for line one (i.e., bit 8) is positioned at a second end of the line. Similarly, line two includes a plurality of components (i.e., 309–317) adapted to receive a plurality of bits (i.e., bits 9–17), where the component 309 adapted to receive the LSB for line two (i.e., bit 9) is positioned at a first end of the line, and the component 317 adapted to receive the MSB for line two (i.e., bit 17) is positioned at a second end of the line. This process is continued for lines three through five, resulting in a plurality of components 318, 327, 336 positioned at a first end of the components' respective line, and a plurality of components 326, 335, 344 positioned at a second end of the components' respective line. These lines (i.e., lines one through five) are then oriented such that the first end of all odd-numbered lines (i.e., lines one, three, and five) are adjacent the second end of all even-numbered lines (i.e., lines two and four), thus aligning the components 300, 318, 336 adapted to receive the LSBs (i.e., bits 0, 18, and 36) of lines one, three, and five with the components 317, 335 adapted to receive the MSBs (i.e., bits 17 and 35) of lines two and four.

Figure 4:
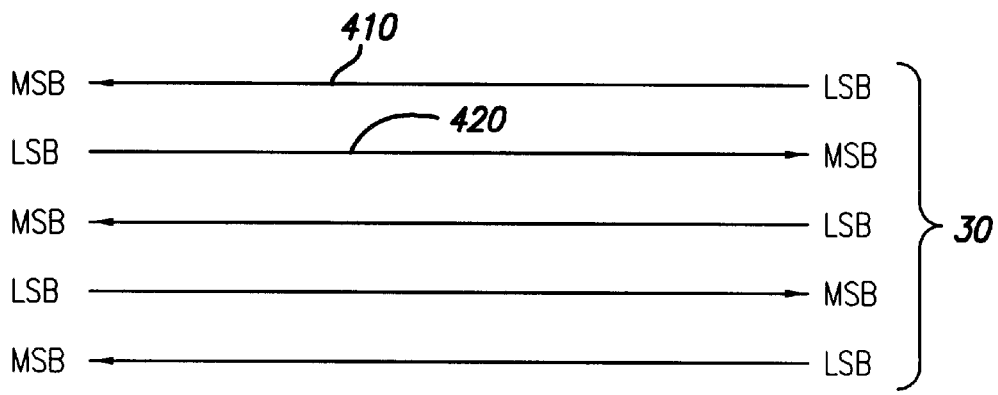
FIG. 4 further illustrates how the lines of components depicted in FIG. 3 are oriented.

This line orientation is perhaps best shown in FIG. 4, where the odd-numbered lines are oriented opposite the even-numbered lines. Specifically, the component adapted to receive the LSB of line one 410 is adjacent the component adapted to receive the MSB of line two 420, and the component adapted to receive the MSB of line one 410 is adjacent the component adapted to receive the LSB of line two 420.

Figure 5:
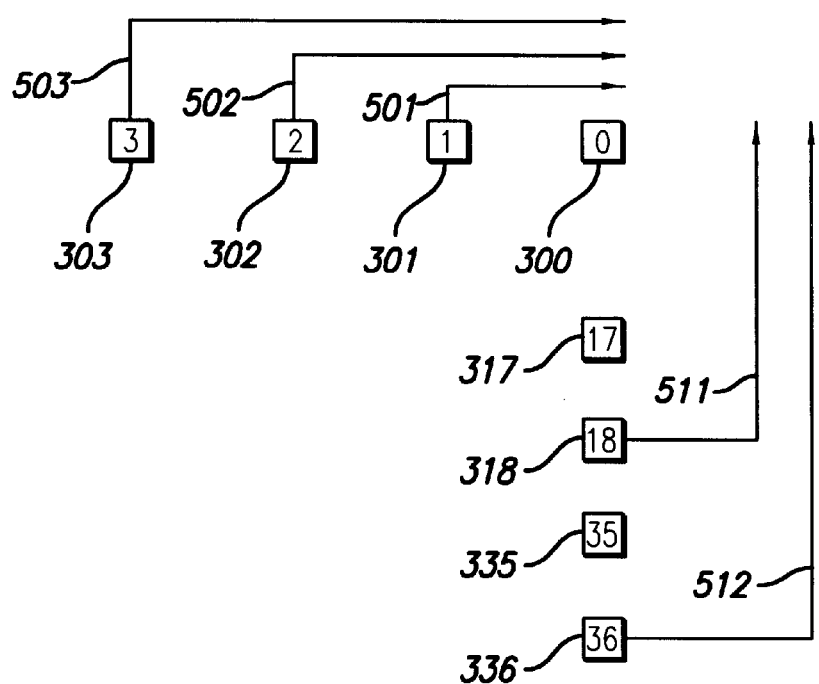
FIG. 5 illustrates one embodiment of how the components depicted in FIG. 3 can be electrically connected.

Referring back to FIG. 3, the plurality of components 300–344 are then electrically connected. One example of how these components can be connected together is illustrated in FIG. 5. Specifically, each component (e.g., 301) is electrically connected to the next-least-significant component (e.g., 300) through a wire (e.g., 501). This allows, for example, data bits to be shifted (in a downward direction) one bit per clock cycle. Additional wires (e.g., 502, 503) could be added (e.g., connecting 300 with 302 and/or 303) to allow data bits to be shifted by more than one bit per clock cycle. Furthermore, each component (e.g., 318) can also be electrically connected to the similarly-positioned component (e.g., 300) from the next-least-significant similarly-oriented line through a wire (e.g., 511). This allows, for example, data bits to be shifted (in a downward direction) two rows (e.g., 18 bits) per clock cycle. Additional wires (e.g., 512) could be added (e.g., connecting 300 with 336) to allow data bits to be shifted by more than two rows per clock cycle.

Figure 6:
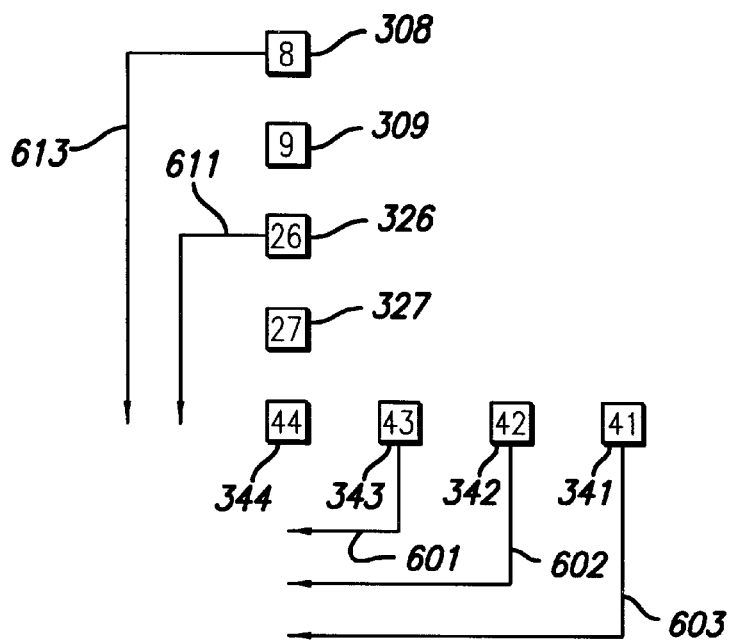
FIG. 6 illustrates another embodiment of how the components depicted in FIG. 3 can be electrically connected.

FIG. 6 illustrates another example of how these components can be connected together. Specifically, each component (e.g., 343) is electrically connected to the next-most-significant component (e.g., 344) through a wire (e.g., 601). This allows, for example, data bits to be shifted (in an upward direction) one bit per clock cycle. Additional wires (e.g., 602, 603) could be added (e.g., connecting 344 with 341 and/or 342) to allow data bits to be shifted by more than one bit per clock cycle. As well, each component (e.g., 326) can also be electrically connected to a similarly-positioned component (e.g., 344) from the next-most-significant similarly-oriented line through a wire (e.g., 611). This allows, for example, data bits to be shifted (in an upward direction) two rows (e.g., 18 bits) per clock cycle. Additional wires (e.g., 613) could be added (e.g., connecting 344 with 308) to allow data bits to be shifted by more than two rows per clock cycle.

By practicing the present invention, a plurality of multiplexers ("MUXs"), for example, could be arranged in a serpentine fashion (as provided by FIG. 3) to perform a function, such as one of the functions depicted in FIG. 1. By arranging the MUXs in a serpentine fashion, wire length and wire congestion are minimized. By using at least two 2:1 MUXs per component, each component can be electrically connected to at least two other components (e.g., one horizontally positioned component and one vertically positioned component), as described in FIGS. 5 and 6. Alternatively, by using at least two higher ratio MUXs (e.g., 3:1, 4:1, 5:1, 6:1, 7:1, 8:1, etc.) per component, additional electrical connections can be made, as further described in FIGS. 5 and 6. It should be appreciated, however, that the present invention is not limited to any particular type of component (e.g., 2:1 MUXs, 3:1 MUXs, full adders, 2:1 propagate/generate devices, 3:1 propagate/generate devices, 4:1 propagate/generate devices, etc.), number of components, or number of electrical devices per component (e.g., two 2:1 MUX per component, etc.), and the arrangement of any components generally known to those skilled in the art (as well as any number of components or any number of electrical devices per component) are within the spirit and scope of this invention. Furthermore, it should be appreciated that the present invention is not limited to performing the functions depicted in FIG. 1, and the performance of other functions that are generally known to those skilled in the art are within the spirit and scope of the invention.

Figure 7:
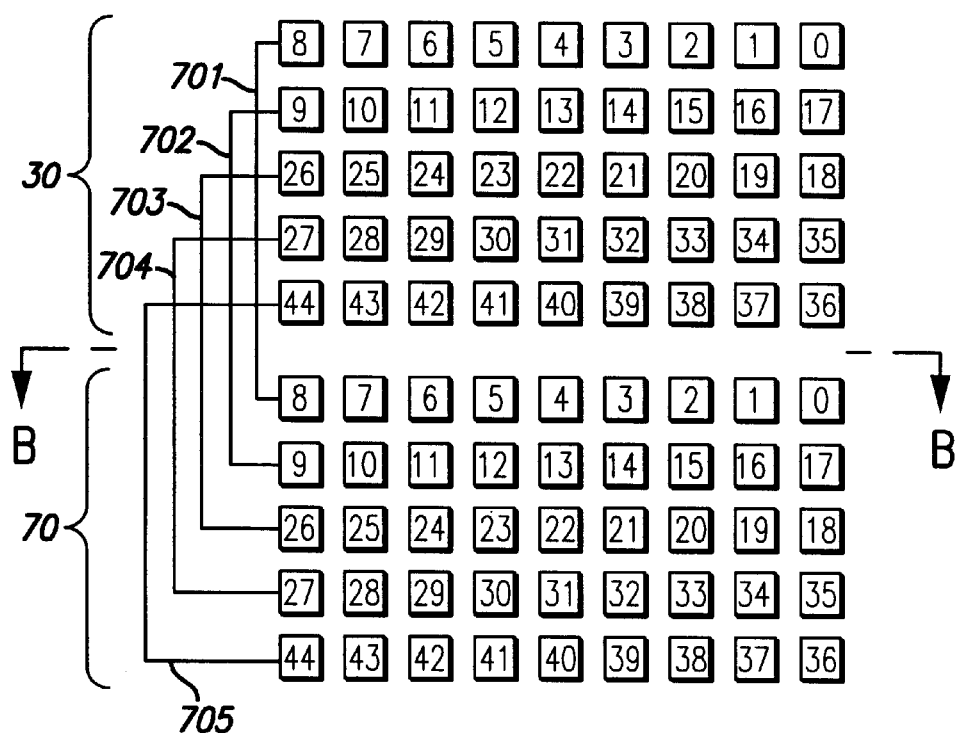
FIG. 7 illustrates one embodiment of how components can be arranged on a chip to perform multiple functions.

The present invention is further directed to the arrangement of components for performing multiple functions (e.g., Montgomery exponentiation, which includes the functions of Montgomery multiplication and addition) in order to minimize wire length and wire congestion. FIGS. 7 and 8 illustrate one embodiment of the present invention, which includes a series of components for performing a primary function 30 and a series of components for performing a secondary function 70—the components for both being arranged in a serpentine fashion (as previously discussed). The functions are then electrically connected through a plurality of inter-function wires (i.e., 701–705).

The drawback with such an arrangement, however, is that while the serpentine arrangement of each function's components minimize intra-function wire congestion, the plurality of wires (i.e., 701–705) needed to electrically connect the primary function (i.e., 30) with the secondary function (i.e., 70) can create inter-function wire congestion. Specifically, the number of wires (i.e., 701–705) passing between the two functions (i.e., at cross-section B) is typically equal to the number of data bits being manipulated. Therefore, if the primary and secondary functions are manipulating one thousand data bits, then one thousand wires will pass between the two functions (i.e., at cross-section B), thus creating congestion between the two functions (i.e., inter-function wire congestion).

FIG. 9 illustrates an example of how two functions (i.e., a primary and secondary function) can be interlaced together to minimize inter-function wire congestion. As shown in FIGS. 9 and 10, the first line 810 of the secondary function (i.e., Fun(2)) is arranged immediately below (and oriented in the same direction as) the first line 410 of the primary function (i.e., Fun(1)). A plurality of wires (e.g., 901, 902) are then used to electrically connect the two functions. Specifically, wires 901 and 902 are used, respectively, to connect the primary function's components adapted to receive data bits 8 and 9 to the secondary function's components adapted to receive equally significant data bits (i.e., data bits 8 and 9). By interlacing the functions in this fashion, wire length and wire congestion are minimized. It should be appreciated, however, that the present invention is not limited to arranging the first line 810 of the secondary function (i.e., Fun(2)) immediately below (and/or oriented in the same direction as) the first line 410 of the primary function (i.e., Fun(1)). Therefore, any interlacing or intertwining of the two functions is within the spirit and scope of the present invention.

In another embodiment of the present invention, the secondary function may further include multiple sub-functions. For example, as shown in FIG. 11, the secondary function is shown including multiple sub-functions (i.e., Fun(2a), Fun(2b), and Fun(2c)), such that the sub-functions are interlaced between the primary function's lines (similar to FIG. 10). It should be appreciated, however, that the number of primary and secondary lines depicted in FIGS. 10 and 11 (indicating the number of functions or sub-functions being performed) is merely to illustrate an embodiment of the present invention, and is not intended to further limit the number of functions or sub-functions that may be interlaced. Therefore, the interlacing or three or more functions (either primary or secondary) and/or sub-functions are within the spirit and scope of this invention.

Having thus described a preferred embodiment of a system and method of placing components for minimizing wire congestion and wire length, it should be apparent to those skilled in the art that certain advantages of the system have been achieve. It should also be appreciated that various modifications, adaptations, and alternative embodiments thereof may be made within the scope and spirit of the present invention. The invention is further defined by the following claims.

What is claimed is:

1. A method of minimizing wire congestion and wire length in performing a function comprising the steps of:
   arranging a plurality of components for performing said function in a plurality of lines, whereby:
      each one of said plurality of lines is substantially parallel to an adjacent one of said plurality of lines;
      each individual line includes a least-significant component adapted to receive a least-significant bit and a most-significant component adapted to receive a most-significant bit, whereby said least-significant component is positioned at a first end of said individual line and said most-significant component is positioned at a second end of said individual line; and each individual line is oriented such that said first end of all odd-numbered lines are substantially adjacent said second end of all adjacent even-numbered lines; and electrically connecting said plurality of components through a plurality of wires.

2. The method of claim 1, wherein said step of electrically connecting said plurality of components further comprises electrically connecting each one of said plurality of components with at least the next-least-significant component if said next-least-significant component exists, said next-least-significant component being adapted to receive the next-least-significant bit.

3. The method of claim 2, wherein said step of electrically connecting said plurality of components further comprises electrically connecting each one of said plurality of components with at least the similarly-positioned component from the next-least-significant similarly-oriented line if said similarly-positioned component exists, said similarly-positioned component being adapted to receive a less-significant bit.

4. The method of claim 1, wherein said step of electrically connecting said plurality of components further comprises electrically connecting each one of said plurality of components with at least the next-most-significant component if said next-most-significant component exists, said next-most-significant component being adapted to receive the next-most-significant bit.

5. The method of claim 4, wherein said step of electrically connecting said plurality of components further comprises electrically connecting each one of said plurality of components with at least the similarly-positioned component from the next-most-significant similarly-oriented line if said similarly-positioned component exists, said similarly-positioned component being adapted to receive a more-significant bit.

6. The method of claim 1, wherein said step of arranging a plurality of components for performing said function further comprises arranging at least one electrical device per each one of said plurality of components for performing said function, said at least one electrical device being selected from a list of electrical devices consisting of a multiplexer and a propagate/generate device.

7. The method of claim 6, wherein said step of arranging at least one electrical device further comprises selecting said at least one electrical device from a list of electrical devices consisting of 2:1, 3:1, 4:1, 5:1, 6:1, 7:1, and 8:1 multiplexers and 2:1, 3:1, and 4:1 propogate/generate devices.

8. The method of claim 1, wherein said step of arranging a plurality of components for performing said function further comprises selecting said function from a list of functions consisting of a shifter and an adder.

9. The method of claim 1, further comprising the steps of:
arranging a plurality of secondary components for performing a secondary function in a plurality of secondary lines, whereby:
each one of said plurality of secondary lines is substantially parallel to an adjacent one of said plurality of secondary lines;
each individual secondary line includes a least-significant secondary component adapted to receive a least-significant bit and a most-significant secondary component adapted to receive a most-significant bit, whereby said least-significant secondary component is positioned at a first end of said individual secondary line and said most-significant secondary component is positioned at a second end of said individual secondary line;

each individual secondary line is oriented such that said first end of all odd numbered secondary lines are substantially adjacent said second end of all adjacent even-numbered secondary lines; and said plurality of secondary lines are interlaced among said plurality of lines such that at least one of said plurality of secondary lines is positioned between adjacent ones of said plurality of lines; and electrically connecting said plurality of secondary components through a plurality of wires.

10. The method of claim 9, wherein said step of electrically connecting said plurality of secondary components further comprises electrically connecting each one of said plurality of secondary components with at least a similarly-positioned component from a similarly-oriented line, said similarly-positioned component being adapted to receive an equally-significant bit.

11. The method of claim 9, wherein said step of arranging a plurality of secondary components for performing a secondary function further comprises arranging said plurality of secondary components for performing Montgomery exponentiation.

12. The method of claim 11, wherein said step of arranging a plurality of secondary components for performing Montgomery exponentiation further comprises arranging said plurality of secondary components for performing Montgomery multiplication and addition.

13. The method of claim 9, wherein said step of arranging said plurality of secondary components for performing a secondary function further includes arranging said plurality of secondary components for performing multiple secondary sub-functions.

14. A method of minimizing wire congestion and wire length in performing a plurality of functions comprising the steps of:
arranging a plurality of primary and secondary components for performing said plurality of functions in a plurality of primary and secondary lines, respectively, whereby:
each one of said plurality of primary and secondary lines is substantially parallel to an adjacent one of said plurality of primary and secondary lines, respectively;
each individual primary and secondary line includes a least-significant component adapted to receive a least-significant bit and a most-significant component adapted to receive a most-significant bit, whereby said least-significant component is positioned at a first end of said individual line and said most-significant component is positioned at a second end of said individual line; and
each individual primary and secondary line is oriented such that said first end of all odd numbered primary lines are substantially adjacent said second end of all adjacent even-numbered primary lines, and said first end of all odd-numbered secondary lines are substantially adjacent said second end of all adjacent even-numbered secondary lines; and electrically connecting said plurality of primary and secondary components through a plurality of wires.

15. An electronic circuit system for performing at least one function, comprising:

a plurality of components arranged in a plurality of lines such that:
- each one of said plurality of lines is substantially parallel to an adjacent one of said plurality of lines;
- each one of said plurality of lines includes a least-significant component adapted to receive a least-significant bit at a first end of said each one of said plurality of lines and a most-significant components adapted to receive a most-significant bit at a second end of said each one of said plurality of lines;
- each one of said plurality of lines is oriented such that said first end of all odd-numbered lines are substantially adjacent said second end of all adjacent even-numbered lines; and
- each one of said plurality of components is electrically connected to at least one other one of said plurality of components.

16. The electronic circuit system according to claim 15, wherein said each one of said plurality of components is electrically connected to at least the next-least-significant component if said next-least-significant component exists, said next-least-significant component being adapted to receive the next-least-significant bit.

17. The electronic circuit system according to claim 16, wherein said each one of said plurality of components is electrically connected to at least the similarly-positioned component from the next-least-significant similarly-oriented line if said similarly-positioned component exists, said similarly-positioned component being adapted to receive a less-significant bit.

18. The electronic circuit system according to claim 15, wherein said each one of said plurality of components is electrically connected to at least the next-most-significant component if said next-most-significant component exists, said next-most-significant component being adapted to receive the next-most-significant bit.

19. The electronic circuit system according to claim 18, wherein said each one of said plurality of components is electrically connected to at least the similarly-positioned component from the next-most-significant similarly-oriented line if said similarly-positioned component exists, said similarly-positioned component being adapted to receive a more-significant bit.

20. The electronic circuit system according to claim 15, wherein each one of said plurality of components further comprises at least one electrical device, said electrical device being selected from a list of electrical devices consisting of a multiplexer and propagate/generate device.

21. The electronic circuit system according to claim 20, wherein said at least one electrical devices is further selected from a list of electrical devices consisting of 2:1, 3:1, 4:1, 5:1, 6:1, 7:1, and 8:1 multiplexers and 2:1, 3:1, and 4:1 propagate/generate devices.

22. The electronic circuit system according to claim 15, wherein said at least one function is selected from a list of functions consisting of a shifter and an adder.

23. The electronic circuit system according to claim 15 for performing at least one secondary function further comprising:
- a plurality of secondary components arranged in a plurality of secondary lines such that:
  - each one of said plurality of secondary lines is substantially parallel to an adjacent one of said plurality of secondary lines;
  - each one of said plurality of secondary lines includes a least-significant secondary component adapted to receive a least-significant bit at a first end of said each one of said plurality of secondary lines and a most-significant secondary component adapted to receive a most-significant bit at a second end of said each one of said plurality of secondary lines;
  - each one of said plurality of secondary lines is oriented such that said first end of all odd-numbered secondary lines are substantially adjacent said second end of all adjacent even-numbered secondary lines;
  - each one of said plurality of secondary components is electrically connected to at least one other one of said plurality of secondary components; and
  - said plurality of secondary lines is interlaced among said plurality of lines such that at least one of said plurality of secondary lines is positioned between adjacent ones of said plurality of lines.

24. The electronic circuit system according to claim 23, wherein each one of said secondary components is electrically connected to at least a similarly-positioned component from a similarly-oriented line, said similarly-positioned component being adapted to receive an equally-significant bit.

25. The electronic circuit system according to claim 23, wherein each one of said plurality of secondary components further comprises a plurality of secondary sub-components for performing secondary sub-functions.

* * * * *